US008632690B2

(12) United States Patent
Adhiprakasha et al.

(10) Patent No.: US 8,632,690 B2
(45) Date of Patent: Jan. 21, 2014

(54) METHOD AND APPARATUS FOR PREVENTING NATIVE OXIDE REGROWTH

(75) Inventors: Edwin Adhiprakasha, Mountain View, CA (US); Shuogang Huang, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 83 days.

(21) Appl. No.: 13/306,661

(22) Filed: Nov. 29, 2011

(65) Prior Publication Data

US 2013/0137276 A1    May 30, 2013

(51) Int. Cl.
*C03C 15/00* (2006.01)
*C03C 25/68* (2006.01)
*H01L 21/302* (2006.01)
*H01L 21/461* (2006.01)

(52) U.S. Cl.
USPC ............................. 216/83; 438/745; 438/749

(58) Field of Classification Search
USPC .......................................................... 216/83
See application file for complete search history.

(56) References Cited

U.S. PATENT DOCUMENTS

| | | | |
|---|---|---|---|
| 4,899,767 A * | 2/1990 | McConnell et al. ........ | 134/56 R |
| 5,294,568 A | 3/1994 | McNeilly et al. | |
| 6,391,794 B1 * | 5/2002 | Chen et al. .................... | 438/745 |
| 7,867,904 B2 | 1/2011 | Chiang et al. | |
| 8,084,400 B2 | 12/2011 | Chiang et al. | |
| 2007/0082508 A1 * | 4/2007 | Chiang et al. ................. | 438/800 |
| 2007/0099806 A1 | 5/2007 | Stewart et al. | |

OTHER PUBLICATIONS

Jung, S., et al.; Wet Etching Technique for Fabrication of GaSb Based Mid Infrared Single Lateral Mode Lasers; Jun. 24, 2011; Power Photonic Corporation; Stony Brook State University of New York; 15 pages.

* cited by examiner

*Primary Examiner* — Binx X Tran
*Assistant Examiner* — Thomas Pham (57) ABSTRACT

A method for combinatorially processing a substrate is provided. The method includes introducing a first etchant into a reactor cell and introducing a fluid into the reactor cell while the first etchant remains in the reactor cell. After initiating the introducing the fluid, contents of the reactor cell are removed through a first removal line and a second removal line, wherein the first removal line extends farther into the reactor cell than the second removal line. A level of the fluid above an inlet to the first removal line is maintained while removing the contents. A second etchant is introduced into the reactor cell while removing the contents through the first removal line and the second removal line. The method includes continuing the introducing of the second etchant until a concentration of the second etchant is at a desired level, wherein the surface of the substrate remains submerged.

15 Claims, 7 Drawing Sheets

METHOD AND APPARATUS FOR PREVENTING NATIVE OXIDE REGROWTH

BACKGROUND

Combinatorial processing enables rapid evaluation of semiconductor processes. The systems supporting the combinatorial processing are flexible to accommodate the demands for running the different processes either in parallel, serial or some combination of the two.

Some exemplary semiconductor wet processing operations include operations for adding (electro-depositions) and removing layers (etch), defining features, preparing layers (e.g., cleans), etc. Similar processing techniques apply to the manufacture of integrated circuits (IC) semiconductor devices, flat panel displays, optoelectronics devices, data storage devices, magneto electronic devices, magneto optic devices, packaged devices, and the like. As feature sizes continue to shrink, improvements, whether in materials, unit processes, or process sequences, are continually being sought for the deposition processes. However, semiconductor companies conduct R & D on full wafer processing through the use of split lots, as the deposition systems are designed to support this processing scheme. This approach has resulted in ever escalating R & D costs and the inability to conduct extensive experimentation in a timely and cost effective manner. Combinatorial processing as applied to semiconductor manufacturing operations enables multiple experiments to be performed on a single substrate.

During combinatorial experiments the substrate surface may be exposed to the ambient environment. In some instances, exposure to the ambient environment may cause a passivating layer to form over the substrate surface. This is observed, for instance, with polysilicon whose surface reacts spontaneously with the ambient environment to form a native oxide layer. Typically, this native oxide layer etches at a markedly different rate than the bulk of the material. This convolutes the determination of the bulk material's true etch rate especially when etching the bulk material with the native oxide layer with a relatively dilute etchant at a relatively low temperature. It is within this context that the embodiments arise.

SUMMARY

Embodiments of the present invention provide a method and an apparatus that prevents re-growth of a native oxide so that etchant formulations may be evaluated as to their ability to etch a material without having to first etch through a native oxide layer formed over the material. Several inventive embodiments of the present invention are described below.

In some embodiments of the invention a method for combinatorially processing a substrate is provided. The method includes introducing a first etchant into a reactor cell isolating a region of a substrate and introducing a fluid into the reactor cell while the first etchant remains in the reactor cell. After initiating the introducing of the fluid, contents of the reactor cell are removed through a first removal line and a second removal line, wherein the first removal line extends further into the reactor cell than the second removal line. A level of the fluid above an inlet to the first removal line is maintained, even while the first removal line removes the contents, to ensure that a surface of the substrate remains submerged by the fluid during the processing. A second etchant is introduced into the reactor cell while removing contents of the reactor cell through the first removal line and the second removal line. The method includes continuing the introducing of the second etchant until a concentration of the second etchant is at a desired level, wherein the surface of the substrate continues to remain submerged during the introducing of the second etchant.

Other aspects of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION

The embodiments described herein provide a method and apparatus for a modular combinatorial processing system providing for control of a sealing pressure between a reactor and a substrate. It will be obvious, however, to one skilled in the art, that the present invention may be practiced without some or all of these specific details. In other instances, well known process operations have not been described in detail in order not to unnecessarily obscure the present invention.

The embodiments described below provide for a method to prevent regrowth of a native oxide so that etchant formulations may be evaluated as to their ability to etch a material without having to first etch through a native oxide layer formed over the material. The native oxide is prevented from forming over a silicon or polysilicon layer between wet chemistry caching/rinsing steps in some embodiments. The embodiments manipulate the vacuum lines of the reactor cell in order to keep the surface being processed submerged in the process fluid. In the embodiments, a first etchant solution is introduced into the reactor cell through a syringe or other suitable means and the etch process takes place to remove any native oxide. Rather than removing the first etchant and exposing, the surface of the substrate and then adding the deionized (DI) water and then following with a second etchant, the DI water is introduced into the reactor cell and after this introduction one of the vacuum lines is activated to remove the solution from the reactor cell. The second vacuum line may also be activated to balance the removal of the solution to ensure that the substrate surface remains submerged by the fluid in the reactor cell and to ensure the fluid does not overflow the reactor cell. In some embodiments, the rate of removal through the two vacuum lines is different. This process was repeated a minimum of three times in some embodiments to ensure that the initial etchant is removed and ensure that the DI water displaces the first etchant. The DI water is then displaced by the second etchant in a similar manner. Thus, after the initial removal of the native oxide by the first etchant, the surface of the substrate remains submerged so that the native oxide is prevented from forming and the second etchant may be evaluated as to the efficacy of removing the layer of material without interference from a native oxide layer.

Semiconductor manufacturing typically includes a series of processing steps such as cleaning, surface preparation, deposition, patterning, etching, thermal annealing, and other related unit processing steps. The precise sequencing and integration of the unit processing steps enables the formation of functional devices meeting desired performance metrics such as efficiency, power production, and reliability.

As part of the discovery, optimization and qualification of each unit process, it is desirable to be able to i) test different materials, ii) test different processing conditions within each unit process module, iii) test different sequencing and integration of processing modules within an integrated processing tool, iv) test different sequencing of processing tools in executing different process sequence integration flows, and combinations thereof in the manufacture of devices such as integrated circuits. In particular, there is a need to be able to test i) more than one material, ii) more than one processing condition, iii) more than one sequence of processing conditions, iv) more than one process sequence integration flow, and combinations thereof, collectively known as "combinatorial process sequence integration", on a single monolithic substrate without the need of consuming the equivalent number of monolithic substrates per material(s), processing condition(s), sequence(s) of processing conditions, sequence(s) of processes, and combinations thereof. This can greatly improve both the speed and reduce the costs associated with the discovery, implementation, optimization, and qualification of material(s), process(es), and process integration sequence(s) required for manufacturing.

Systems and methods for High Productivity Combinatorial (HPC) processing are described in U.S. Pat. No. 7,544,574 filed on Feb. 10, 2006, U.S. Pat. No. 7,824,935 filed on Jul. 2, 2008, U.S. Pat. No. 7,871,928 filed on May 4, 2009, U.S. Pat. No. 7,902,063 filed on Feb. 10, 2006, and U.S. Pat. No. 7,947,531 filed on Aug. 28, 2009 which are all herein incorporated by reference. Systems and methods for HPC processing are further described in U.S. patent application Ser. No. 11/352,077 filed on Feb. 10, 2006, claiming priority from Oct. 15, 2005, U.S. patent application Ser. No. 11/419,174 filed on May 18, 2006, claiming priority from Oct. 15, 2005, U.S. patent application Ser. No. 11/674,132 filed on Feb. 12, 2007, claiming priority from Oct. 15, 2005, and U.S. patent application Ser. No. 11/674,137 filed on Feb. 12, 2007, claiming priority from Oct. 15, 2005 which are all herein incorporated by reference.

HPC processing techniques have been successfully adapted to wet chemical processing such as etching and cleaning. HPC processing techniques have also been successfully adapted to deposition processes such as physical vapor deposition (PVD), atomic layer deposition (ALD), and chemical vapor deposition (CVD).

Figure 1:
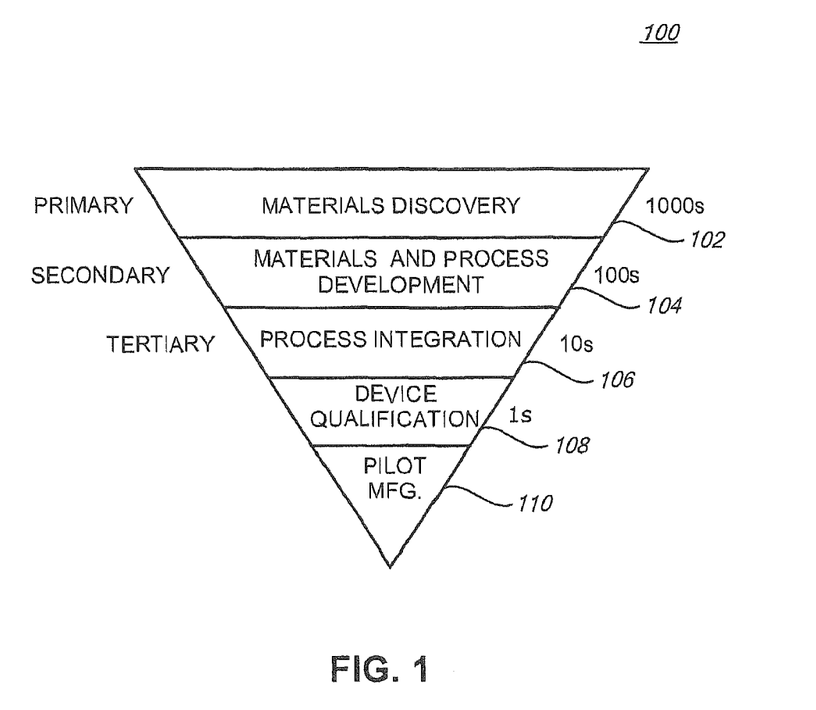
FIG. 1 illustrates a schematic diagram for implementing combinatorial processing and evaluation using primary, secondary, and tertiary screening.

FIG. 1 illustrates a schematic diagram, 100, for implementing combinatorial processing and evaluation using primary, secondary, and tertiary screening. The schematic diagram, 100, illustrates that the relative number of combinatorial processes run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages can be used to refine the success criteria and provide better screening results.

For example, thousands of materials are evaluated during a materials discovery stage, 102. Materials discovery stage, 102, is also known as a primary screening stage performed using primary screening techniques. Primary screening techniques may include dividing substrates into coupons and depositing materials using varied processes. The materials are then evaluated, and promising candidates are advanced to the secondary screen, or materials and process development stage, 104. Evaluation of the materials is performed using metrology tools such as electronic testers and imaging tools (i.e., microscopes).

The materials and process development stage, 104, may evaluate hundreds of materials (i.e., a magnitude smaller than the primary stage) and may focus on the processes used to deposit or develop those materials. Promising materials and processes are again selected, and advanced to the tertiary screen or process integration stage, 106, where tens of materials and/or processes and combinations are evaluated. The tertiary screen or process integration stage, 106, may focus on integrating the selected processes and materials with other processes and materials.

The most promising materials and processes from the tertiary screen are advanced to device qualification, 108. In device qualification, the materials and processes selected are evaluated for high volume manufacturing, which normally is conducted on full substrates within production tools, but need not be conducted in such a manner. The results are evaluated to determine the efficacy of the selected materials and processes. If successful, the use of the screened materials and processes can proceed to pilot manufacturing, 110.

The schematic diagram, 100, is an example of various techniques that may be used to evaluate and select materials and processes for the development of new materials and processes. The descriptions of primary, secondary, etc. screening and the various stages, 102-110, are arbitrary and the stages may overlap, occur out of sequence, be described and be performed in many other ways.

This application benefits from High Productivity Combinatorial (HPC) techniques described in U.S. patent application Ser. No. 11/674,137 filed on Feb. 12, 2007 which is hereby incorporated for reference in its entirety. Portions of the '137 application have been reproduced below to enhance the understanding of the present invention. The embodiments described herein enable the application of combinatorial techniques to process sequence integration in order to arrive at a globally optimal sequence of semiconductor manufacturing operations by considering interaction effects between the unit manufacturing operations, the process conditions used to effect such unit manufacturing operations, hardware details used during the processing, as well as materials characteristics of components utilized within the unit manufacturing operations. Rather than only considering a series of local optimums, i.e., where the best conditions and materials for each manufacturing unit operation is considered in isolation, the embodiments described below consider interactions effects introduced due to the multitude of processing operations that are performed and the order in which such multitude of processing operations are performed when fabricating a device. A global optimum sequence order is therefore derived and as part of this derivation, the unit processes, unit process parameters and materials used in the unit process operations of the optimum sequence order are also considered.

The embodiments described further analyze a portion or sub-set of the overall process sequence used to manufacture a semiconductor device. Once the subset of the process sequence is identified for analysis, combinatorial process sequence integration testing is performed to optimize the materials, unit processes, hardware details, and process sequence used to build that portion of the device or structure. During the processing of some embodiments described herein, structures are formed on the processed substrate are equivalent to the structures formed during actual production of the semiconductor device. For example, such structures may include, but would not be limited to, contact layers, buffer layers, absorber layers, or any other series of layers or unit processes that create an intermediate structure found on semiconductor devices. While the combinatorial processing varies certain materials, unit processes, hardware details, or process sequences, the composition or thickness of the layers or structures or the action of the unit process, such as cleaning, surface preparation, deposition, surface treatment, etc. is substantially uniform through each discrete region. Furthermore, while different materials or unit processes may be used for corresponding layers or steps in the formation of a structure in different regions of the substrate during the combinatorial processing, the application of each layer or use of a given unit process is substantially consistent or uniform throughout the different regions in which it is intentionally applied. Thus, the processing is uniform within a region (inter-region uniformity) and between regions (intra-region uniformity), as desired. It should be noted that the process can be varied between regions, for example, where a thickness of a layer is varied or a material may be varied between the regions, etc., as desired by the design of the experiment.

The result is a series of regions on the substrate that contain structures or unit process sequences that have been uniformly applied within that region and, as applicable, across different regions. This process uniformity allows comparison of the properties within and across the different regions such that the variations in test results are due to the varied parameter (e.g., materials, unit processes, unit process parameters, hardware details, or process sequences) and not the lack of process uniformity. In the embodiments described herein, the positions of the discrete regions on the substrate can be defined as needed, but are preferably systematized for ease of tooling and design of experimentation. In addition, the number, variants and location of structures within each region are designed to enable valid statistical analysis of the test results within each region and across regions to be performed.

Figure 2:
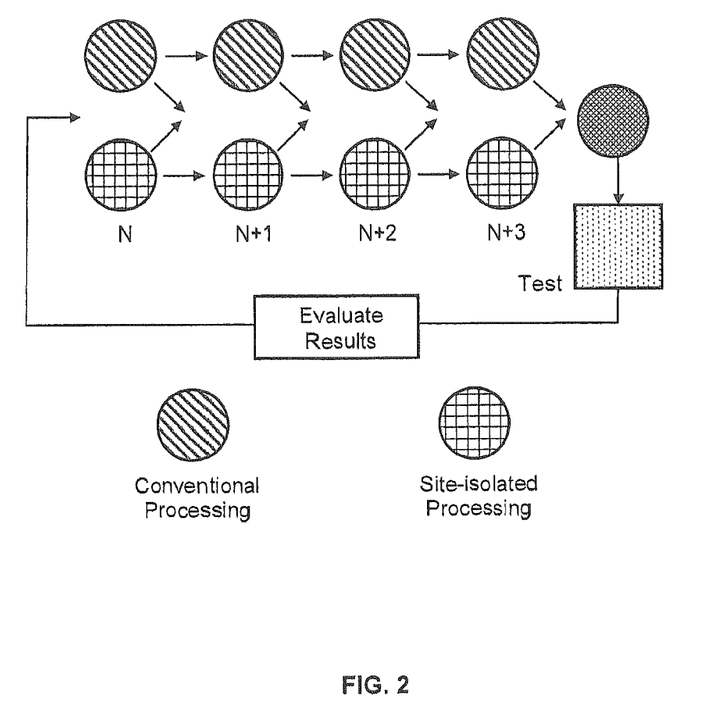
FIG. 2 is a simplified schematic diagram illustrating a general methodology for combinatorial process sequence integration that includes site isolated processing and/or conventional processing in accordance with some embodiments of the invention.

FIG. 2 is a simplified schematic diagram illustrating a general methodology for combinatorial process sequence integration that includes site isolated processing and/or conventional processing in accordance with some embodiments of the invention. In some embodiments, the substrate is initially processed using conventional process N. In one exemplary embodiment, the substrate is then processed using site isolated process N+1. During site isolated processing, an HPC module may be used, such as the HPC module described in U.S. patent application Ser. No. 11/352,077 filed on Feb. 10, 2006. The substrate can then be processed using site isolated process N+2, and thereafter processed using conventional process N+3. Testing is performed and the results are evaluated. The testing can include physical, chemical, acoustic, magnetic, electrical, optical, etc. tests. From this evaluation, a particular process from the various site isolated processes (e.g. from steps N+1 and N+2) may be selected and fixed so that additional combinatorial process sequence integration may be performed using site isolated processing for either process N or N+3. For example, a next process sequence can include processing the substrate using site isolated process N, conventional processing for processes N+1, N+2, and N+3, with testing performed thereafter.

It should be appreciated that various other combinations of conventional and combinatorial processes can be included in the processing sequence with regard to FIG. 2. That is, the combinatorial process sequence integration can be applied to any desired segments and/or portions of an overall process flow. Characterization, including physical, chemical, acoustic, magnetic, electrical, optical, etc. testing, can be performed after each process operation, and/or series of process operations within the process flow as desired. The feedback provided by the testing is used to select certain materials, processes, process conditions, and process sequences and eliminate others. Furthermore, the above flows can be applied to entire monolithic substrates, or portions of monolithic substrates such as coupons.

Under combinatorial processing operations the processing conditions at different regions can be controlled independently. Consequently, process material amounts, reactant species, processing temperatures, processing times, processing pressures, processing flow rates, processing powers, processing reagent compositions, the rates at which the reactions are quenched, deposition order of process materials, process sequence steps, hardware details, etc., can be varied from region to region on the substrate. Thus, for example, when exploring materials, a processing material delivered to a first and second region can be the same or different. If the processing material delivered to the first region is the same as the processing material delivered to the second region, this processing material can be offered to the first and second regions on the substrate at different concentrations. In addition, the material can be deposited under different processing parameters. Parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, hardware details of the gas distribution assembly, etc. It should be appreciated that these process parameters are exemplary and not meant to be an exhaustive list as other process parameters commonly used in semiconductor manufacturing may be varied.

As mentioned above, within a region, the process conditions are substantially uniform, in contrast to gradient processing techniques which rely on the inherent non-uniformity of the material deposition. That is, the embodiments, described herein locally perform the processing in a conventional manner, e.g., substantially consistent and substantially uniform, while globally over the substrate, the materials, processes, and process sequences may vary. Thus, the testing will find optimums without interference from process variation differences between processes that are meant to be the same. It should be appreciated that a region may be adjacent to another region in some embodiments or the regions may be isolated and, therefore, non-overlapping. When the regions are adjacent, there may be a slight overlap wherein the materials or precise process interactions are not known, however, a portion of the regions, normally at least 50% or more of the area, is uniform and all testing occurs within that region. Further, the potential overlap is only allowed with material of processes that will not adversely affect the result of the tests. Both types of regions are referred to herein as regions or discrete regions.

Figure 3A:
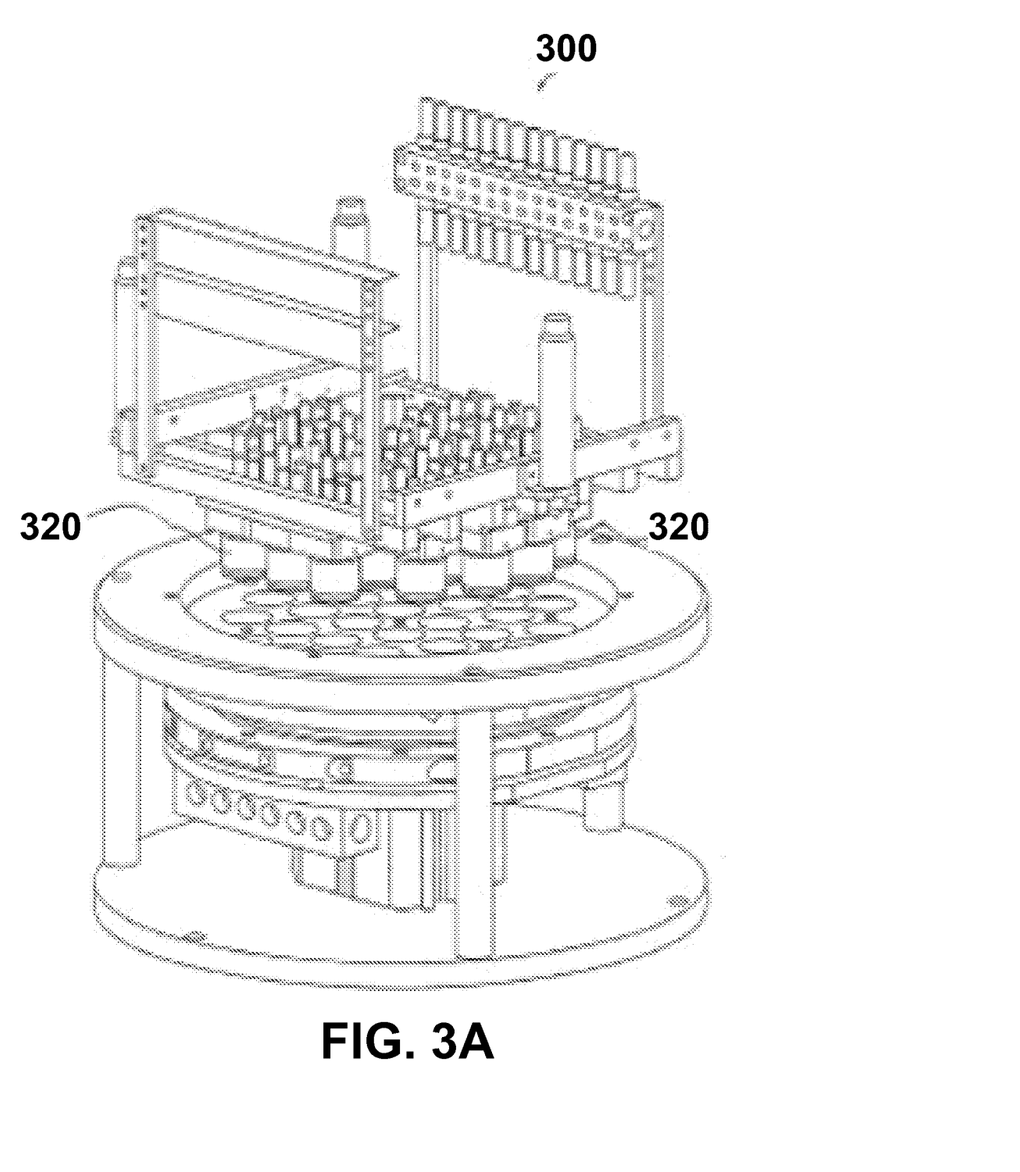
FIG. 3A is a simplified schematic diagram of a combinatorial system which may incorporate wet processing experiments or semiconductor manufacturing process sequences and unit operations in order to combinatorially evaluate various semiconductor manufacturing processes so that an optimum process may be found in a minimum amount of time in accordance with some embodiments of the invention.

FIG. 3A is a simplified schematic diagram of a combinatorial system which may incorporate wet processing experiments or semiconductor manufacturing process sequences and unit operations in order to combinatorially evaluate various semiconductor manufacturing processes so that an optimum process may be found in a minimum amount of time in accordance with some embodiments of the invention. System 300 includes a plurality of flow cells 320 which may be modular in design as in order to efficiently evaluate a plurality of processes and utilize the same tool on various programs addressing customer specific problems and enabling the use of using customer specific wafers without requiring re-tooling. In some embodiments, twenty eight flow cells are provided for twenty eight discrete regions of a twelve inch wafer. It should be appreciated that this is not meant to be limiting as any number of flow cells 320 may be accommodated on a system depending on various factors including the size and shape of the substrate being evaluated, the size of the regions on the substrate, etc. It should be appreciated that a monolithic block design is or a modular design for the flow cell 320 may be integrated with the embodiments of the invention. In addition, a rail system enabling flow cells 320 to be tailored to any pitch (e.g., spacing) of regions is provided. A flexible reactor based system is provided in addition to a static manifold system. System 300 includes a plurality of connections (not shown for illustrative purposes) distributed to each of flow cells 320. One skilled in the art will appreciate that the system of FIG. 3A may be connected to various inputs that may be affixed to system 300 through racks or external to system 300. Exemplary inputs include a dispense manifold to dispense any process fluids utilized in the system, a mix vessel for optionally mixing fluids prior to delivery to system 300, and any required power and gas inputs to operate the system. In addition, a waste collection mechanism may be in communication to receive process fluids evacuated from the reaction chambers or bypassed through flow cells 320. It should be further appreciated that while flow cells 320 are depicted as each having a certain number of inputs and outputs, the number of inputs and outputs may be varied as the illustrations are exemplary. System 300 is configured to concurrently process different regions of the substrate differently. Further details on the flow cell configuration may be found in application Ser. No. 11/966,809 entitled "Vented Combinatorial Processing Cell" filed on Dec. 28, 2007 and claiming priority to U.S. Provisional Application No. 61/014,672 filed on Dec. 18, 2007, both of which are herein incorporated by reference.

Figure 3B:
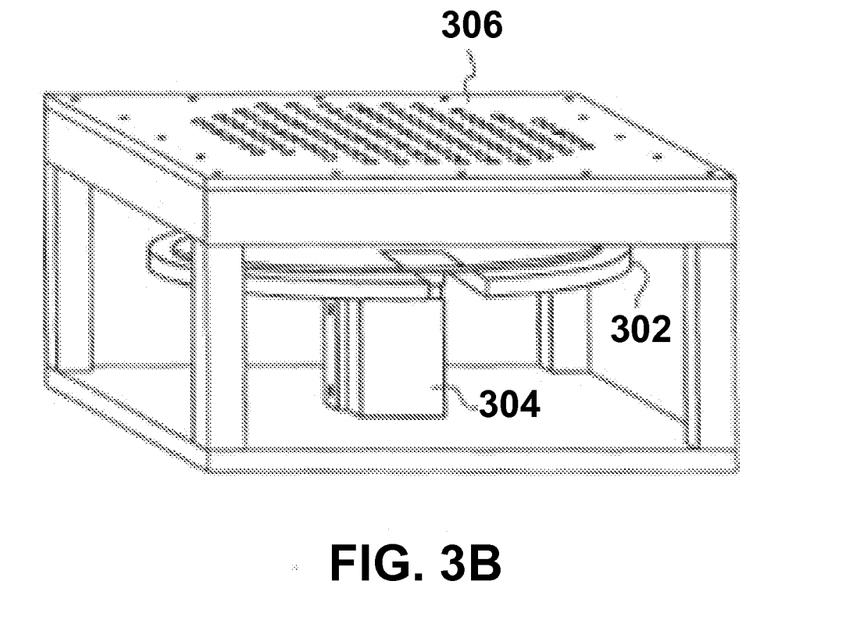
FIG. 3B is a simplified schematic diagram of an alternative combinatorial system which may incorporate wet processing experiments or semiconductor manufacturing process sequences and unit operations in order to combinatorially evaluate various semiconductor manufacturing processes so that an optimum process may be found in a minimum amount of time in accordance with some embodiments of the invention.

FIG. 3B is a simplified schematic diagram of an alternative combinatorial system which may incorporate wet processing experiments or semiconductor manufacturing process sequences and unit operations in order to combinatorially evaluate various semiconductor manufacturing processes so that an optimum process may be found in a minimum amount of time in accordance with some embodiments of the invention. The system of FIG. 3B includes a top plate 306 having a plurality of apertures in which fluids from a syringe or other suitable means may be applied to a substrate or coupon residing on support 302. Support 302 is coupled to base 304, which is moveable in some embodiments. Further details on the system of FIG. 3B may be found in U.S. application Ser. No. 11/352,077 entitled "Methods for Discretized Processing and Process Sequence Integration of Regions of a Substrate" filed on Feb. 10, 2006 and claiming priority to U.S. Provisional Application No. 60/725,186 filed on Oct. 11, 2005, both of which are herein incorporated by reference. It should be appreciated that the systems illustrated in FIGS. 3A and 3B are exemplary and not meant to be limiting as the embodiments described herein may be integrated into any system benefitting from preventing the regrowth of a native oxide layer on a substrate.

Figure 3C:
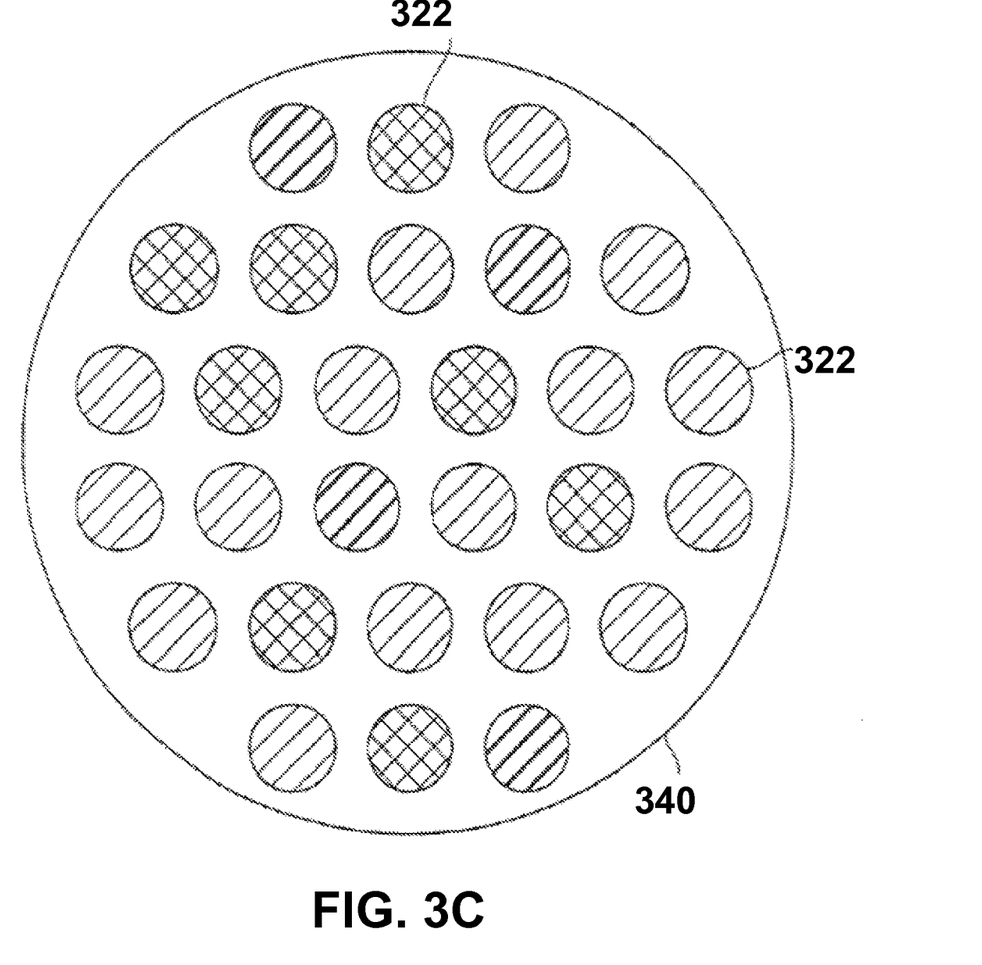
FIG. 3C is a top view of a substrate having regions processed differently through the modular head system described herein in accordance some embodiments of the invention.

FIG. 3C is a top view of a substrate having regions processed differently through the modular head system described herein in accordance with some embodiments of the invention. Substrate 340 has a plurality of regions 320, which have been combinatorially processed. Twenty eight regions are provided on substrate 340 in this exemplary embodiment. Substrate 340 is illustrated as having a substantially flat surface in this exemplary embodiment, although this is not meant to be limiting. More or fewer regions can be defined in alternative embodiments. It should be appreciated that on substrate 340 a wealth of knowledge exists on a single substrate as each of regions 320 may have some property or characteristic of the process altered. Thus, the information available for each region as well as the interaction of each region with previous or subsequent process operations or materials may be harvested to provide data on an optimum material, unit process and/or process sequence in a highly efficient manner. While FIG. 3C illustrates regions 320 as isolated and not overlapping, the regions may overlap in some embodiments. In another embodiment a region refers to a localized area on a substrate which is, was, or is intended to be used for processing or formation of a selected material. The region can include one region and/or a series of regular or periodic regions pre-formed on the substrate. The region may have any convenient shape, e.g., circular, rectangular, elliptical, wedge-shaped, etc. In some embodiments, regions 320 are predefined on the substrate. However, the processing may define the regions 320 in another embodiment.

Figure 4:
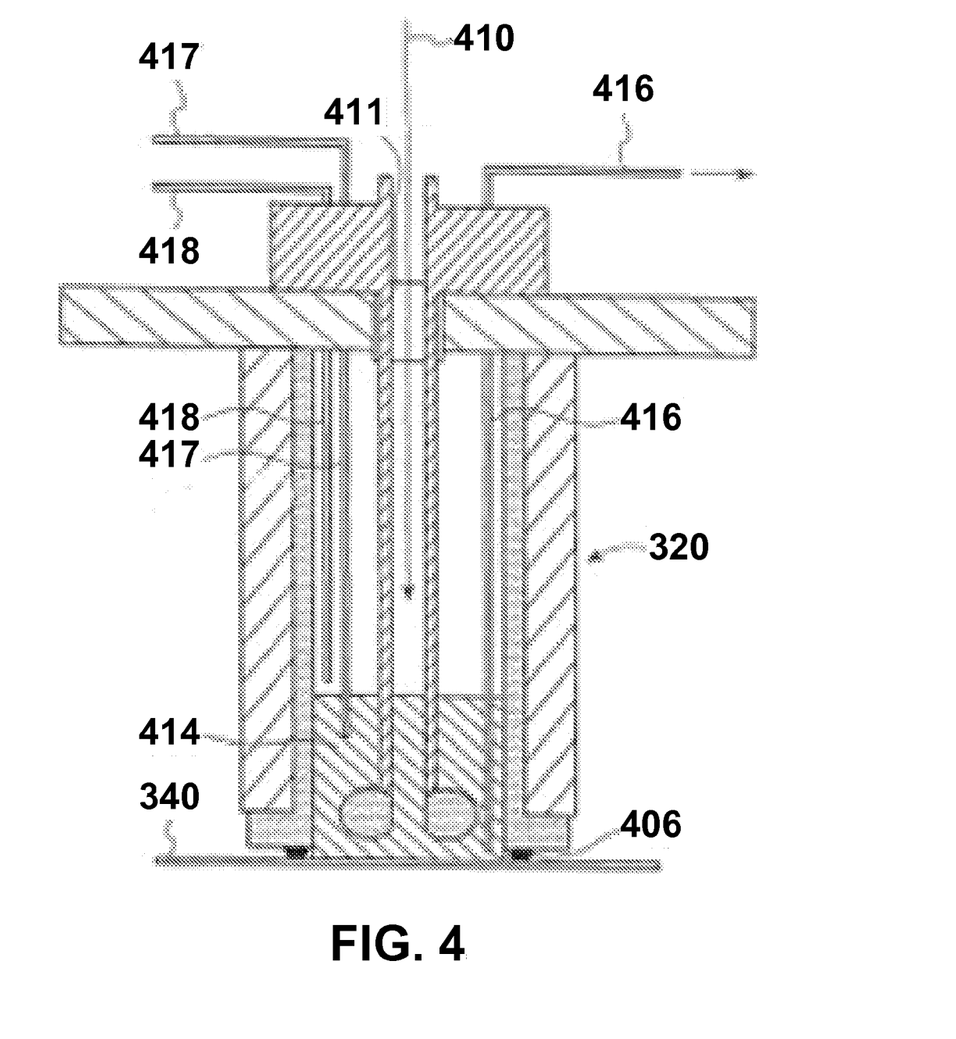
FIG. 4 is a cross sectional view of a flow cell or reactor in accordance with some embodiments of the invention.

FIG. 4 is a cross sectional view of a flow cell or reactor in accordance with some embodiments of the invention. As shown in FIG. 4, when the flow cell 320 is in contact with the substrate 340, processing fluids 414 are delivered to the isolated region of the substrate 340 through a probe 410 of the delivery system. In some embodiments, the processing cell is sealed on its upper surface, such as with a septum 411. When delivering processing fluids to the flow cell 320, the probe 410 pierces the septum 411 in some embodiments. In other embodiments, the septum 411 is optional and the flow cell may be open to the external environment so that a delivery device such as a motorized syringe can provide the etchants and fluids mentioned herein. The sealing element 406 prevents the processing fluids 414 from leaving the isolated region. In other embodiments, sealing element 306 may be a removable sleeve as discussed in the applications incorporated by reference. In some embodiments, the processing system is designed for the flow cell 320 to hold between about 10 µL and about 10,000 µL.

Flow cell 320 is illustrated as having a plurality of inlets and outlets. Outlet 416 is referred to as a low vacuum outlet in some embodiments. Outlet 417 may be referred to as a mid-vacuum outlet in some embodiments. As illustrated outlet 416 extends further into the reactor than outlet 417. Inlet 418 may be utilized to dispense fluids into processing cell 320 as an alternative to probe 410. It should be appreciated that while outlets 416 and 417 are embodied as the low vacuum outlet and the mid vacuum outlet, respectively, and inlet 418 is listed as an alternative to probe 410 for dispensing fluids into flow cell 320, this configuration is not meant to be limiting. That is, each of the inlets and outlets may function as a dedicated inlet or outlet or function as a dual inlet/outlet. Through the configuration of FIG. 4 the processing fluid, whether an etchant or a rinsing fluid, may be dispensed into flow cell 320, and contemporaneously with dispensing the fluid into the processing cell, the fluid may be removed through one of or both of outlets 416 and 417. The rate of withdrawal from outlets 416 and 417 may be equivalent or different when both outlets are being used. In some embodiments, outlets 416 and 417 may be tubes extending into each of the reactor cells.

In one embodiment, a hydrofluoric acid (HF) solution is first introduced into the reactor cells to initially etch away the native oxide, deionized water (DIW) is then introduced to rinse away the HF solution. However, instead of subsequently using the low-vacuum outlet to empty the reactor cell the DIW/HF solution is not allowed to go below at the mid-vacuum outlet level. Thus, the solution over the substrate serves as a barrier that prevents the surface of the substrate from being exposed to oxygen, thereby preventing native oxide regrowth. In some embodiments, the DIW is added multiple times and the DIW/HF solution is removed in between each addition. A mild etchant, such as a dilute aqueous solution of ammonium hydroxide and hydrogen peroxide, also referred to as SC-1 or APM, is introduced simultaneously with the DIW being emptied or removed from the reactor cells. The volume of the mild etchant entering the cells balances the volume of DIW being emptied from the reactor cells so that the substrate is remains submerged by liquid at any time in the process. It should appreciated that the steady state fill and empty process may take place over a sufficient amount of time to ensure the concentration of SC-1 in the cells matches the SC-1 concentration at the inlet. In addition, a batch process where the SC-1 is added multiple times, e.g., through a syringe, may be employed in place of a steady state fill and empty process.

Figure 5:
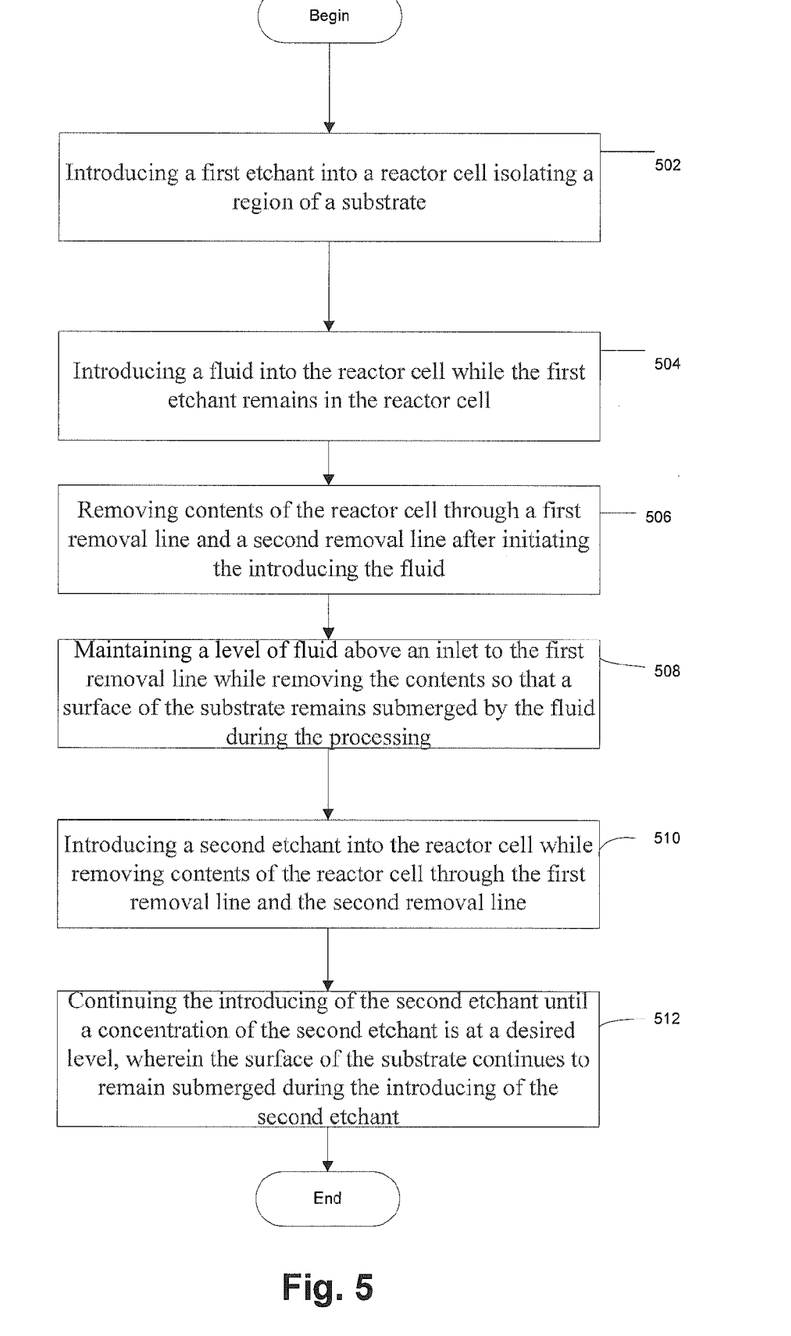
FIG. 5 is a flow chart illustrating the method operations for processing a substrate in accordance with some embodiments of the invention.

FIG. 5 is a flow chart illustrating the method operations for processing a substrate in accordance with some embodiments of the invention. The method initiates with operation 502 where a first etchant is introduced into a reactor cell isolating the region of a substrate. In some embodiments, a reactor cell such as the reactor cell of FIG. 4 may isolate a region of the substrate. In some embodiments, the first etchant is a dilute solution of hydrofluoric acid and the etchant is utilized to remove a native oxide layer from a surface of the isolated region of the substrate. The method then advances to operation 504 where a fluid is introduced into the reactor cell while the first etchant remains in the reactor cell. In some embodiments the fluid is DIW. The method then proceeds to operation 506 where the contents of the reactor cells are removed through a first removal line and optionally a second removal line after initiating the introducing of the fluid. Thus, the fluid such as DIW, may be added to the reactor cell while the contents of the reactor cell are removed through the vacuum lines mentioned with reference to FIG. 4. The fluid may be introduced into the reactor cell in a batch mode, e.g., through a motorized syringe in some embodiments, or as part of a steady state mode fill and empty process in other embodiments. In some embodiments additional fluid is added a total of three times in a batch mode prior to initiating operation 510.

In operation 508 a level of the fluid is maintained above an inlet of the first removal line while removing the contents of the reactor cell so that a surface of the substrate remained submerged by the fluid during the processing. It should be appreciated that keeping the surface of the substrate submerged in the processing fluid prevents regrowth of the native oxide layer on a surface of the substrate. The method then advances to operation 510 where a second etchant is introduced into the reactor cell while removing contents of the reactor cell through the first removal line and the optional second removal line. In some embodiments the second etchant is an aqueous solution of ammonium hydroxide and hydrogen peroxide and may be combinatorially evaluated at a low temperature, such as ambient temperature, through the equipment described herein. The method then moves to operation 512 where the introducing of the second etchant continues until a concentration of the second transient in the processing cell is at a desired level. It should be appreciated that the surface of the substrate continues to remain submerged during the introduction of the second etchant. Thus, through the embodiments described above the actual etch rate of the second etchant may be evaluated more accurately as the native oxide does not reappear to impede the etch rate.

Any of the operations described herein that form part of the invention are useful machine operations. The invention also relates to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims In the claims, elements and/or steps do not imply any particular order of operation, unless explicitly stated in the claims.

What is claimed is:

1. A method for processing a substrate, comprising:
   introducing a first etchant into a reactor cell wherein the reactor cell is operable to isolate a region of a surface of a substrate;
   introducing a fluid into the reactor cell while the first etchant remains in the reactor cell;
   after initiating the introducing the fluid, removing contents of the reactor cell through a first removal line and a second removal line, wherein the first removal line extends further into the reactor cell than the second removal line;
   maintaining a level of the contents of the reactor cell above an inlet to the first removal line while removing the contents so that the isolated region of the surface of the substrate remains submerged by the contents of the reactor cell during the processing;

introducing a second etchant into the reactor cell while removing the contents of the reactor cell through the first removal line and the second removal line; and continuing the introducing of the second etchant until a concentration of the second etchant is at a desired level, wherein the isolated region of the surface of the substrate continues to remain submerged during the introducing of the second etchant.

2. The method of claim 1, wherein each introducing operation is performed through a syringe.

3. The method of claim 2, wherein the syringe is motorized.

4. The method of claim 1, wherein the first etchant is hydrofluoric acid.

5. The method of claim 1, wherein the second etchant comprises a solution of ammonium hydroxide and hydrogen peroxide.

6. The method of claim 1, wherein a rate of removal through the first removal line is different than a rate of removal through the second removal line.

7. The method of claim 1, wherein the fluid is deionized water.

8. A method for processing a substrate, comprising:

etching a native oxide film from a site isolated region of a substrate using a reactor operable to define the site isolated region;

introducing an amount of fluid into the reactor upon completion of the etching;

contemporaneously with the introducing the amount of the fluid, removing a first etchant from the reactor through a first removal line and a second removal line, wherein an inlet to the first removal line and a surface of the substrate within the site isolated region remain submerged during the removing;

introducing an additional amount of the fluid into the reactor during the removing;

introducing an amount of a second etchant into the reactor contemporaneously with removing contents from the reactor, wherein a surface of the substrate within the site isolated region remains submerged; and etching a layer of the site isolated region of the substrate with the second etchant;

wherein the first removal line extends further into the reactor cell than the second removal line.

9. The method of claim 8, wherein the layer of the site isolated region is one of poly silicon or silicon.

10. The method of claim 8, wherein a plurality of site isolated regions is processed contemporaneously.

11. The method of claim 10, wherein each of the plurality of site isolated regions is processed differently.

12. The method of claim 8, wherein the first etchant and the contents are removed through a tube extending into the reactor.

13. The method of claim 8, wherein the introducing the additional amount of fluid is performed multiple times prior to introducing the amount of the second etchant.

14. The method of claim 8, wherein the introducing the amount of the second etchant is performed multiple times.

15. The method of claim 8 wherein the introducing the amount of fluid and the removing the first etchant occur in a steady state mode.

\* \* \* \* \*